United States Patent
Chu et al.

(10) Patent No.: US 6,352,103 B1
(45) Date of Patent: Mar. 5, 2002

(54) HIGH PERFORMANCE NOTEBOOK PC COOLING SYSTEM

(75) Inventors: Herman W. Chu, Palo Alto, CA (US); Rakesh Bhatia, Austin, TX (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 08/859,154

(22) Filed: May 20, 1997

Related U.S. Application Data

(60) Provisional application No. 60/038,341, filed on Feb. 27, 1997, and provisional application No. 60/018,083, filed on May 22, 1996.

(51) Int. Cl.[7] .................................................. F28F 7/00
(52) U.S. Cl. ................. 165/80.3; 165/185; 165/104.33; 165/122; 165/121; 257/722; 257/715; 361/687; 361/697; 174/15.2; 174/16.3
(58) Field of Search .......................... 165/80.3, 104.33, 165/121, 122, 123, 124, 185; 361/687, 697; 257/722, 715; 174/15.2, 16.3

(56) References Cited

U.S. PATENT DOCUMENTS

| | | | |
|---|---|---|---|
| 4,513,812 A | | 4/1985 | Papst et al. |
| 4,979,074 A | * | 12/1990 | Morley et al. ........... 165/185 X |
| 5,218,513 A | | 6/1993 | Brown |
| 5,331,510 A | * | 7/1994 | Ouchi et al. ........ 165/140.33 X |
| 5,338,214 A | | 8/1994 | Steffes et al. |
| 5,339,214 A | | 8/1994 | Nelson |
| 5,409,055 A | * | 4/1995 | Tanaka et al. ......... 165/104.33 |
| 5,440,450 A | | 8/1995 | Lau et al. |
| 5,502,618 A | | 3/1996 | Chiou |
| 5,513,070 A | | 4/1996 | Xie et al. |
| 5,526,875 A | | 6/1996 | Lin |
| 5,535,094 A | | 7/1996 | Nelson et al. |
| 5,549,155 A | | 8/1996 | Meyer, IV et al. |
| 5,561,338 A | * | 10/1996 | Roberts et al. ......... 165/185 X |
| 5,598,320 A | * | 1/1997 | Toedtman et al. .. 165/104.33 X |
| 5,621,613 A | | 4/1997 | Haley et al. |
| 5,630,469 A | * | 5/1997 | Butterbaugh et al. ... 165/185 X |
| 5,634,351 A | | 6/1997 | Larson et al. |
| 5,690,468 A | * | 11/1997 | Hong ..................... 165/185 X |
| 5,735,340 A | * | 4/1998 | Mira et al. .............. 165/185 X |
| 5,828,549 A | * | 10/1998 | Gandre et al. .......... 165/185 X |
| 5,917,699 A | * | 6/1999 | Hung et al. ................. 361/697 |
| 5,959,836 A | * | 9/1999 | Bhatia ........................ 361/687 |
| 5,964,279 A | * | 10/1999 | Mochizuki et al. .... 165/80.3 X |
| 5,966,286 A | * | 10/1999 | O'Connor et al. ..... 165/80.3 X |

* cited by examiner

*Primary Examiner*—Christopher Atkinson
(74) *Attorney, Agent, or Firm*—Blakely, Sokoloff, Taylor & Zafman LLP

(57) ABSTRACT

The invention consists of a modular apparatus for cooling an integrated circuit chip in a compact computer. The apparatus includes a heat collector assembly operatively connected to the chip, a heat exchange assembly and a heat pipe extending from the heat collector assembly to the heat exchange assembly. The heat exchange assembly includes a primary housing, a fan at one end of the housing, and a secondary housing at the opposite end of the primary housing. The secondary housing has a plurality of fins and the primary housing as a plenum chamber between the fins and the fan. The invention also comprises a high-performance notebook computer and cooling apparatus combination which includes a pivoted outer cover and a cooling system located along the pivoting axis of the outer cover.

25 Claims, 14 Drawing Sheets

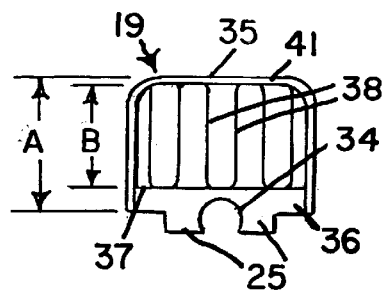
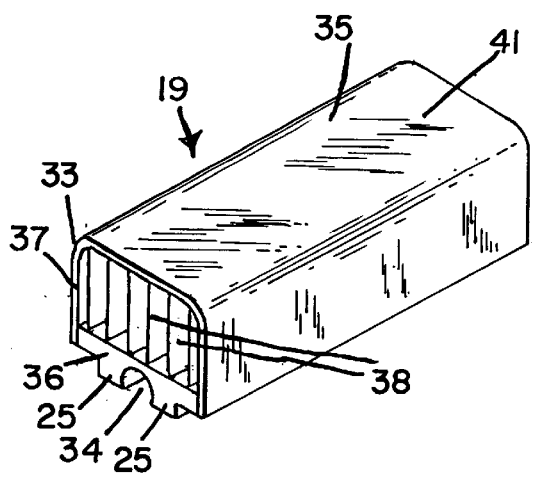
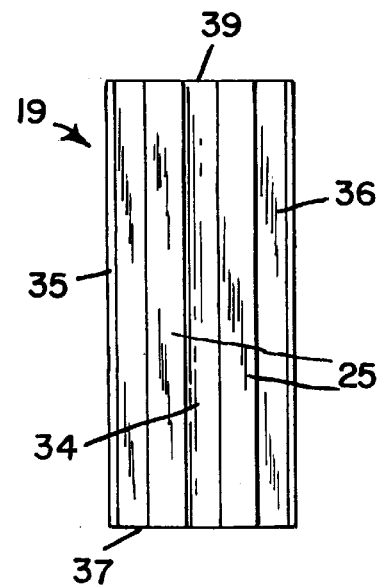
| Design | Fin Count | Dimensions in MM | | |
| --- | --- | --- | --- | --- |
| | | A | B | C |
| 1 | 6 | 14.28 | 11.00 | 5.74 |
| 2 | 7 | 18.28 | 15.00 | 4.67 |
FIG. 12

HIGH PERFORMANCE NOTEBOOK PC COOLING SYSTEM

CROSS-REFERENCE TO RELATED APPLICATIONS

This is a continuing application of U.S. Provisional Patent Application Ser. No. 60/018,083, filed on May 22, 1996 (pending) and U.S. Provisional Patent Application Ser. No. 60/038,341 (pending) filed Feb. 27, 1997.

STATEMENT REGARDING FEDERALLY SPONSORED RESEARCH OR DEVELOPMENT

This invention has been created without the sponsorship or funding of any federally sponsored research or development program.

BACKGROUND OF THE INVENTION

The present invention is generally directed to a thermal management system for cooling high performance microprocessors. The present invention is specifically directed for cooling the integrated circuit chip in a "high performance" notebook computer. However, the invention can also be used in other classes of computer systems, such as desktop PCs and workstation computers. The capacity of notebook computers have increased substantially. More powerful chips are employed which also develop more heat. Since notebook computers have limited space and electrical power, this additional heat developed by the chip must be dissipated without substantially increasing the size of the cooling system.

Two methods of cooling have been employed in the past to cool microprocessors in notebook computers: First, by natural convection, i.e. no fan is used in the system. Second, by forced convection where small fans are implemented. Most thermal designs for either of the prior art cooling methods have been cumbersome in assembling. Numerous screws are used during the manufacturing process. The prior art cooling systems for microprocessors are inadequate for dealing with the additional heat generated by the "high-performance" microprocessors. These and other difficulties associated with prior art cooling systems have been obviated by the present invention.

It is, therefore, a principal objection of the invention to provide an efficient and compact cooling system for the integrated circuit chip in a compact computer.

A further object of the invention is the provision of a compact and effective cooling system for a high performance integrated circuit chip within a notebook computer.

Another object of the invention is the provision of a fan enhanced cooling system for the integrated circuit chip of a compact computer which enables the fan to function efficiently without appreciable loss in the effective life of the fan.

A still further object of the invention is the provision of a modular cooling system for a high performance integrated circuit chip in a compact computer which is relatively easy to assemble and install in the computer and which occupies relatively little space.

Still another object of the invention is the provision of a high performance notebook computer which incorporates a cooling system for the integrated circuit chip with relatively little impact on the usable space within the computer.

With these and other objects in view, as will be apparent to those skilled in the art, the invention resides in the combination of parts set forth in the specification and covered by the claims appended hereto.

SUMMARY OF THE INVENTION

The invention consists of a modular apparatus for cooling an integrated circuit chip in a compact computer. The apparatus includes a heat collector assembly operatively connected to the chip, a heat exchange assembly and a heat pipe extending from the heat collector assembly to the heat exchange assembly. The heat exchange assembly includes a primary housing, a fan at one end of the housing, and a secondary housing at the opposite end of the primary housing. The secondary housing has a plurality of fins and the primary housing as a plenum chamber between the fins and the fan. The invention also comprises a high-performance notebook computer and cooling apparatus combination which includes a pivoted outer cover and a cooling system located along the pivoting axis of the outer cover.

DETAILED DESCRIPTION OF THE DRAWINGS

The character of the invention, however, may be best understood by reference to one of the forms, as illustrated by the accompanying drawings, in which:

FIG. 9 is an isometric view of the heat sink assembly portion of the heat exchange assembly;

FIG. 10 is a front elevational view of the heat sink assembly;

FIG. 11 is a bottom plan view of the heat sink assembly;

FIG. 12 is a chart showing dimensions of two sizes of the heat sink assembly;

DETAILED DESCRIPTION OF THE PREFERRED EMBODIMENT

Figure 3:
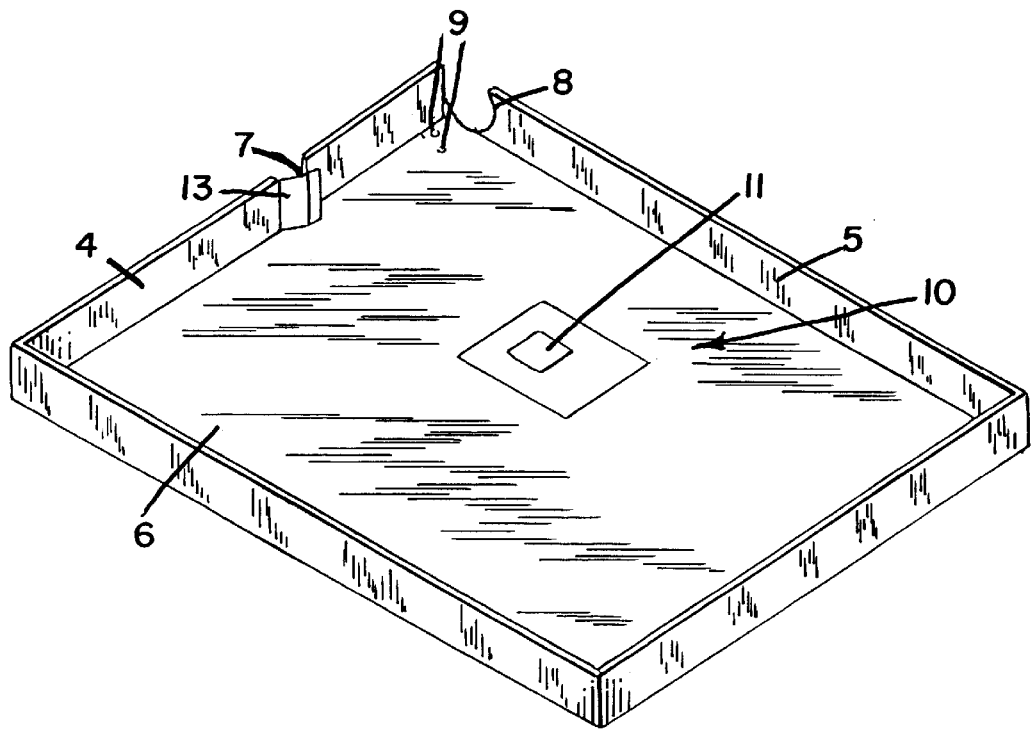
FIG. 3 is an isometric view of the chassis of a notebook computer.
Figure 4:
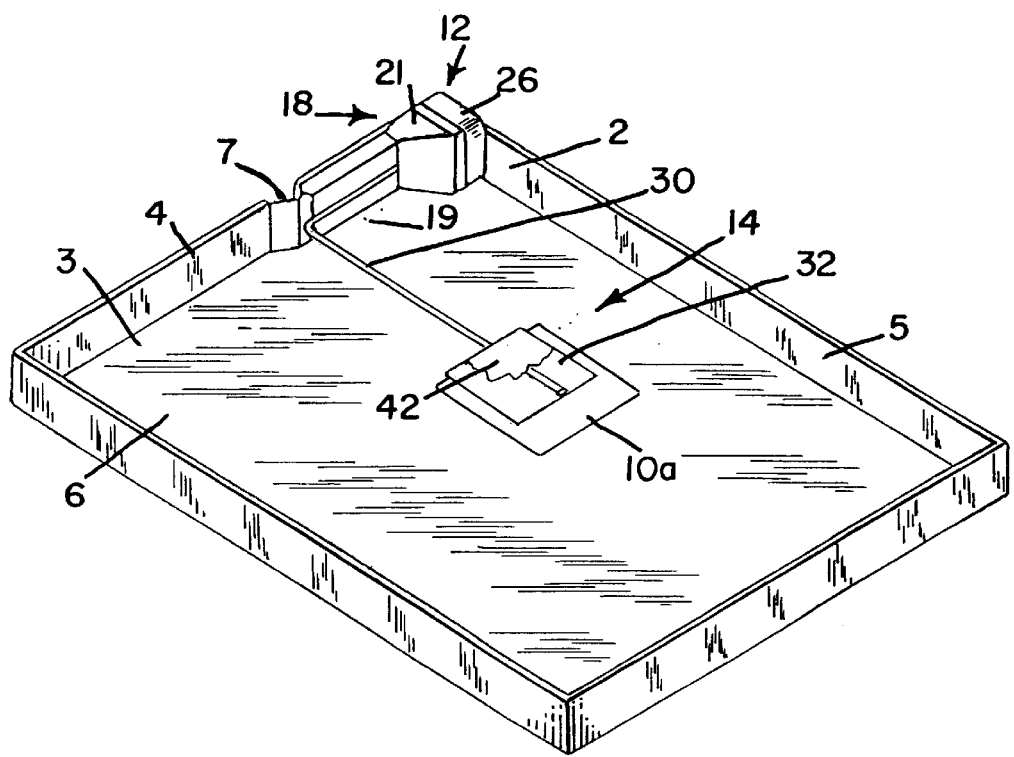
FIG. 4 is an isometric view of the chassis of the notebook computer showing the cooling system of the present invention applied thereto.
Figure 5:
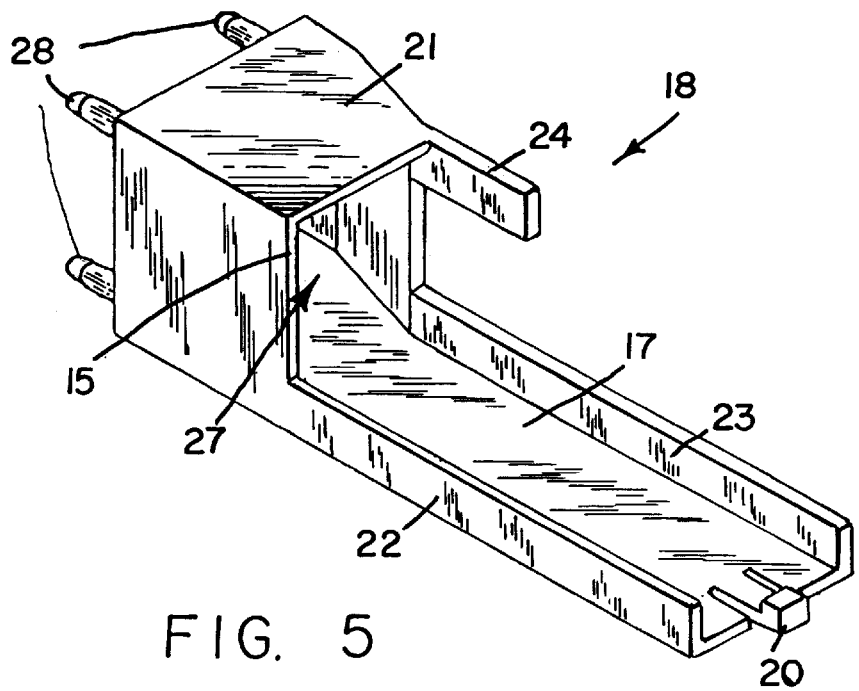
FIGS. 5 and 6 are isometric views of the plastic housing portion of the heat exchange assembly, looking from the air inlet end of the assembly.
Figure 6:
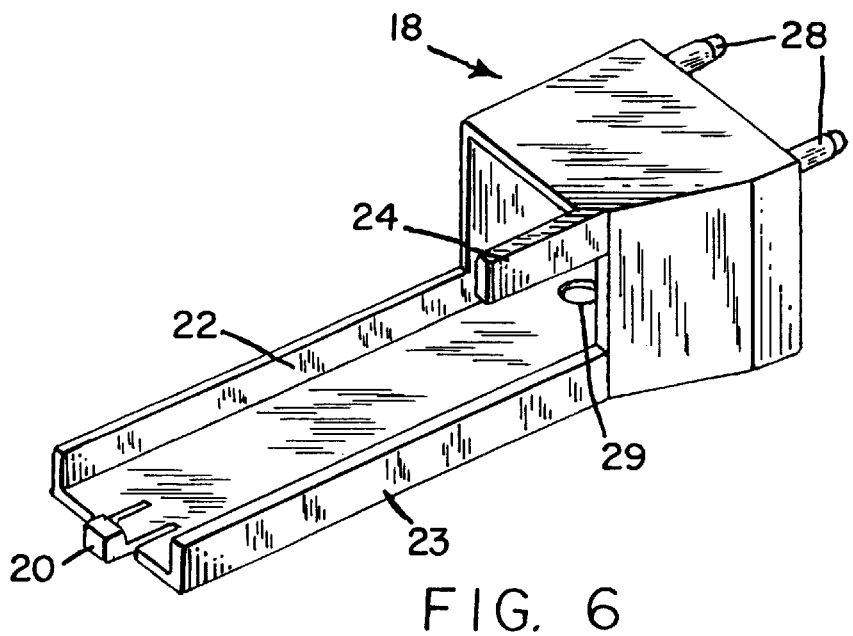
Figure 7:
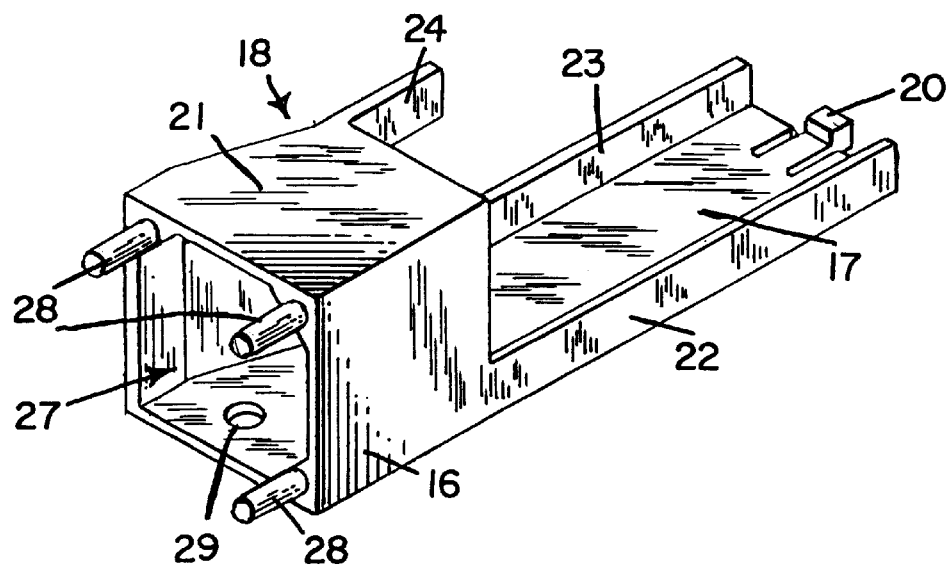
FIGS. 7 and 8 are isometric views of the plastic housing portion of the heat exchange assembly, looking from the air outlet end of the assembly.
Figure 8:
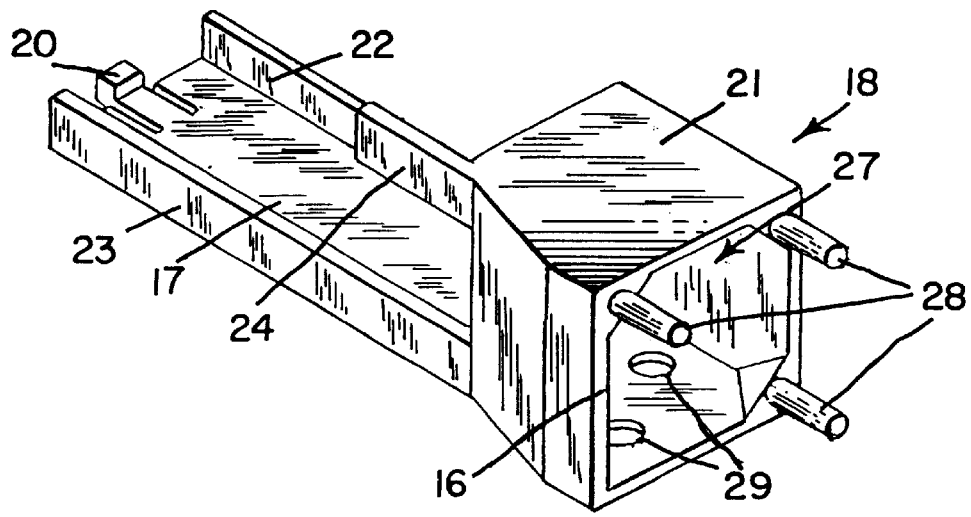
Figure 18:
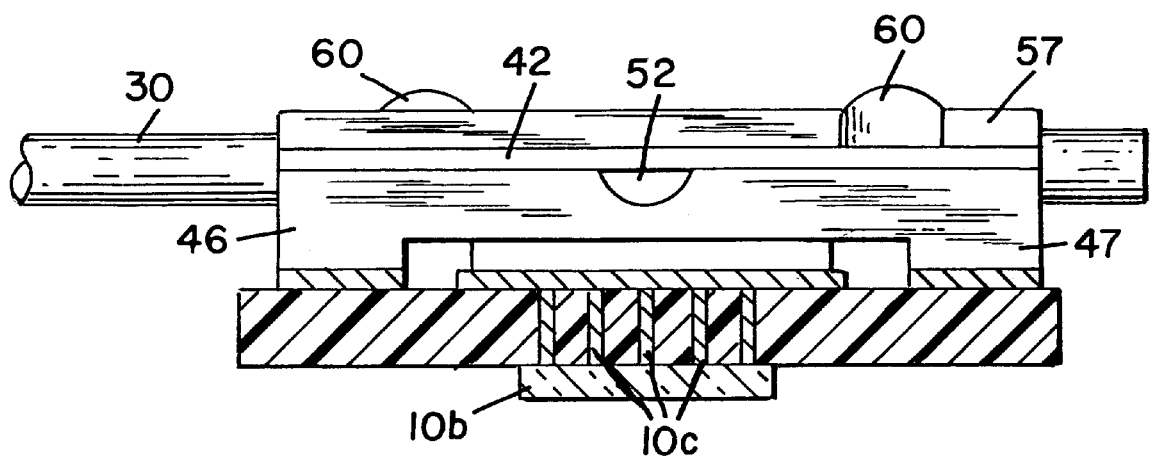
FIG. 18 is a side elevational view of the heat collector assembly shown applied to a circuit board which includes an integrated circuit chip.

Referring first to FIGS. 3 and 4, the cooling system of the present invention is generally indicated by the reference numeral 2 and is shown applied to a chassis of a computer. The chassis, generally indicated by the reference numeral 3, comprises a bottom wall 6, a side wall 4, and a back wall 5. The side wall 4 has an air inlet opening 7. The bottom wall 5 has an air outlet opening 8. A pair of locating pins 9 extend upwardly from the bottom wall 6 adjacent the outlet opening 8. Referring also to FIG. 18, a microprocessor package, generally indicated by the reference numeral 10, is located on the bottom wall 6 and includes a circuit board 10a, and a heat conductive pad 11 which is thermally connected to an integrated circuit chip 10b by thermally conductive vias 10c.

The cooling system 2 comprises a heat exchange assembly, generally indicated by the reference numeral 12, located between the inlet opening 7 and the outlet opening 8, a heat collector assembly, generally indicated by the reference numeral 14, and an L-shaped heat pipe 30. The heat collector assembly 14 is in thermal contact with the heat conductive pad 11. One end of the heat pipe 30 is connected to the heat collector assembly 14. The opposite end of the heat pipe 30 is connected to the heat exchange assembly 12. A baffle plate 13 extends from the inlet opening 7 to an inlet portion of the heat exchange assembly 12.

Figure 1:
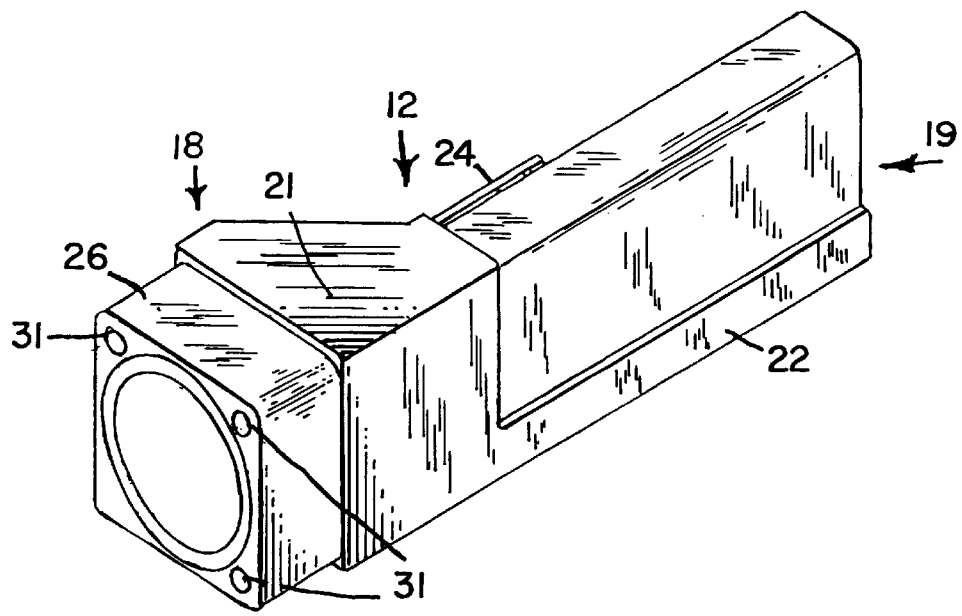
FIG. 1 is an isometric view of a heat exchange assembly of the present invention, looking from the air outlet end of the assembly.
Figure 2:
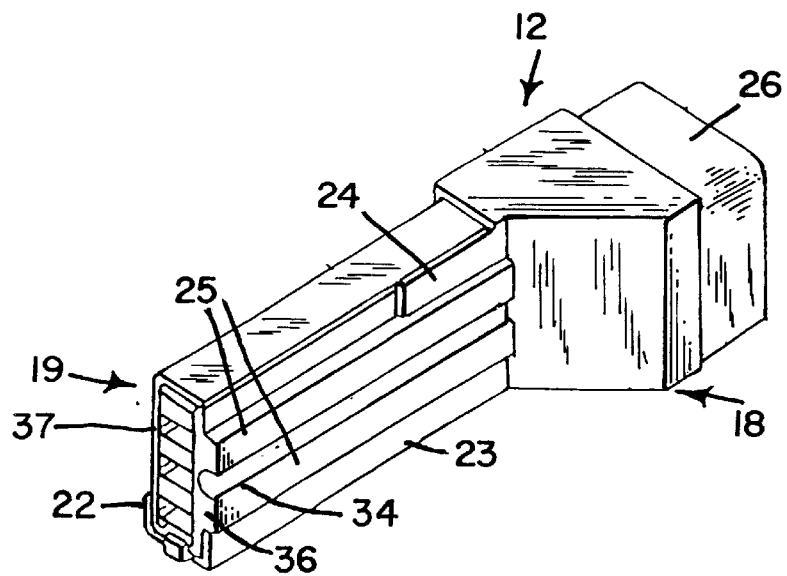
FIG. 2 is an isometric view of the heat exchange assembly, looking from the air inlet end of the assembly.

Referring to FIGS. 1 and 2, the heat exchange assembly 12 comprises a primary housing of thermoplastic material, generally indicated by the reference numeral 18, a heat sink assembly, generally indicated by the reference numeral 19, and a fan 26. The primary housing is preferably made of a thermoplastic material but it could also be made of metal. The primary housing 18, heat sink assembly 19 and fan 26 are modular units that are removably assembled into a single unit as the heat exchange assembly 12, as shown in FIGS. 1 and 2.

Referring specifically to FIGS. 5–8, the primary housing 18 includes a base wall 17 and a shroud 21. A pair of side rails 22 and 23 extend from the shroud 21 along the base wall 17. A third rail 24 extends from the shroud 21 above and spaced from the rail 23. There is a resiliently flexible retaining tab 20 which is located at the end of the base wall 17 opposite the shroud 21. The shroud 21 contains a plenum chamber 27 which has an inlet opening 15 facing the tab 20 and an outlet opening 16 facing away from the tab 20. The base wall 17 has a pair of apertures 29 at the shroud 21. A plurality of pins 28 extend outwardly from the shroud 21. No screws are used in assembling the modular components of the heat exchange assembly 12. As shown in FIGS. 1 and 2, the fan 26 has apertures 31 for receiving the plastic pins 28 that the fan snaps onto the shroud 21 with a tolerance fit. A gasket, not shown, is located between the fan and the shroud. The gasket provides a seal between the fan and housing 18 and a dampening of vibration from the fan.

Figure 13:
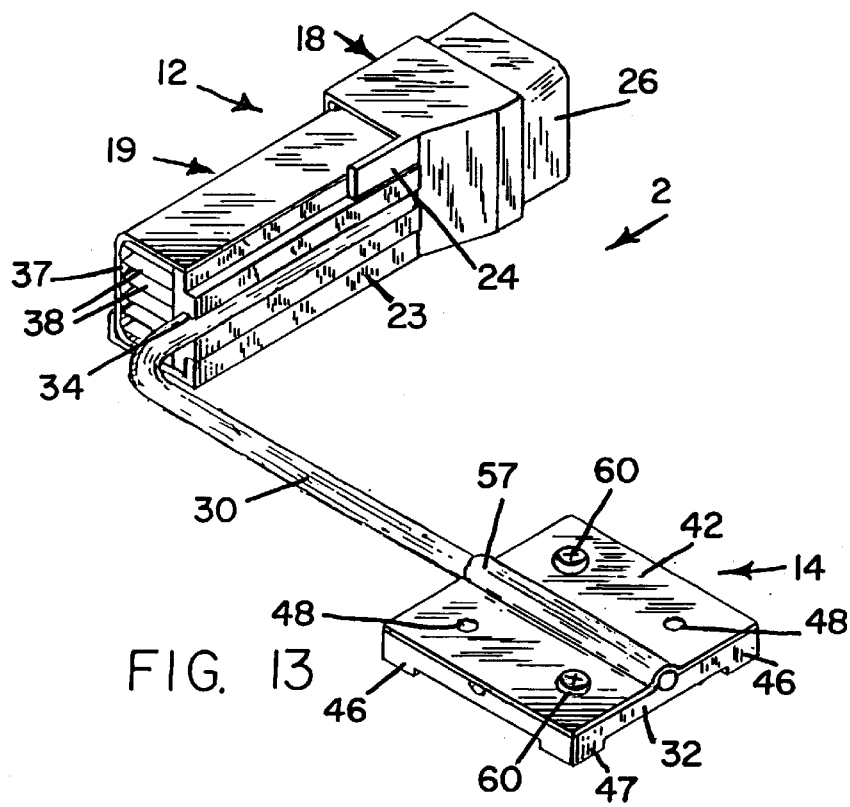
FIG. 13 is an isometric view of a cooling system for the present invention, looking from above the cooling system.

Referring to FIGS. 10–12, the heat sink assembly 19 comprises a tubular metallic secondary housing 35 having a cavity 33 which is generally rectangular in cross-section. The cavity 33 has an inlet opening 37 and an outlet opening 39. The secondary housing 35 has a base wall 36 and pair of elongated pedestals 25 which extend downwardly from the base wall 36 and which define an elongated trench or first groove 34. A convoluted fin structure is located within the chamber 33. The convoluted fin structure is formed from a sheet of thermally conductive and heat radiating material which is folded into a plurality of spaced fins 38. The fins 38 extend from the base wall 36 to the top wall 41 of the secondary housing 35 and are fixed to the walls 36 and 41. This convoluted fin structure is shown in U.S. Pat. of Morosas No. 5,494,098. The disclosure of this patent is incorporated herein by reference. The chart of FIG. 13 illustrates the ideal dimensions of fin height and spacing relative to the height of the housing for two size models of the invention. The height of the housing is indicated by dimension A in FIG. 10. Fin height is indicated by dimension B as depicted in FIG. 10. Dimension C is equal to double the distance between two adjacent fins.

The heat sink assembly 19 is applied to the primary housing 18 by sliding the heat sink assembly longitudinally between the rails 22, 23, and 24 so that the base wall 36 faces the rails 23 and 24 and the outlet opening 39 of the secondary housing 35 is adjacent the inlet opening 15 of the plenum 27. As the heat sink assembly 19 is inserted, retaining tab 20 is forced outwardly and snaps back inwardly behind the heat sink assembly 19 adjacent the inlet opening 37 of the primary heat sink assembly. The rails 22, 23, and 24 and the retaining tab 20 constitutes latch means to releasably maintain the heat sink assembly 19 on the primary housing 18. The rails 22, 23, and 24 prevent the assembly 19 from moving laterally relative to the primary housing 18. The retaining tab 22 prevents the assembly 19 from moving longitudinally relative to the primary housing 18.

Figure 16:
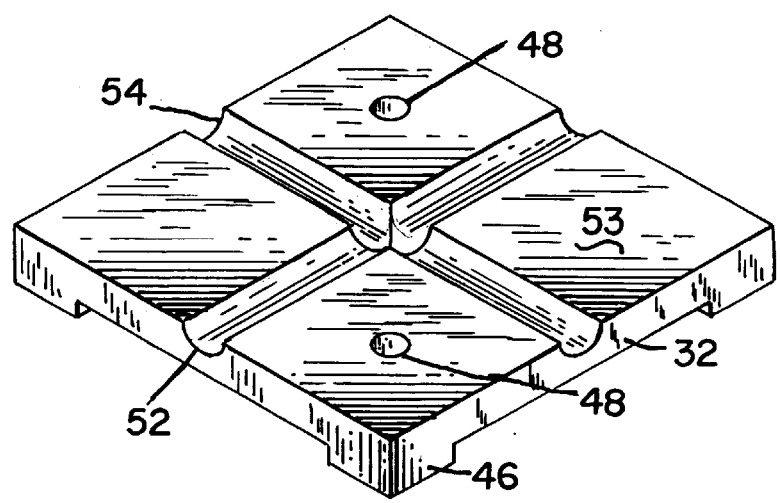
FIG. 16 is an isometric view of the interposer plate portion of the heat collector assembly, looking from above the interposer plate.
Figure 17:
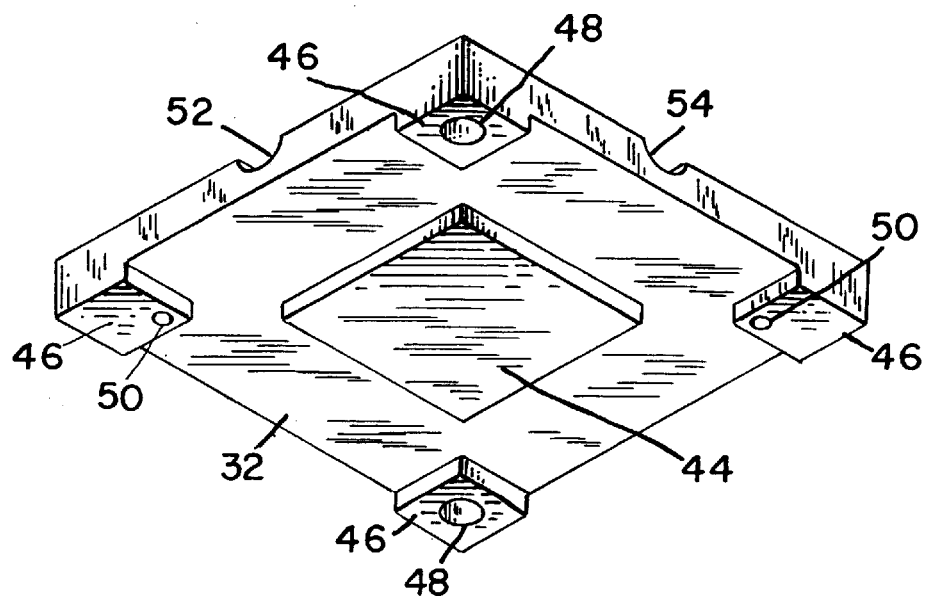
FIG. 17 is an isometric view of the interposer plate, looking from below the interposer plate.

Referring to FIGS. 13–17, the heat collector assembly 14 comprises an interposer plate 32, a cover plate 42, and the heat pipe 30. The underside of the interposer plate 32 has a center protrusion 44 and a corner protrusion 47 at each corner of the pad. Two diagonally opposite corner protrusions 47 have a threaded aperture 48. The other two diagonally opposite corner protrusions 47 have an apertures 50 for receiving locating pins, not shown, on the bottom wall 6 of the chassis 3. The interposer plate 32 has an upper surface 53 which contains a pair of second semi-circular grooves 52 and 54. The groove 52 is normal to the groove 54 so that the grooves 52 and 54 cross at the center of the interposer plate as shown in FIG. 16. The cover plate 42 has an aperture 56 adjacent each corner of the plate and a central uplifted portion 57 which defines a semi-circular groove 58 at the underside of the cover plate.

Figure 14:
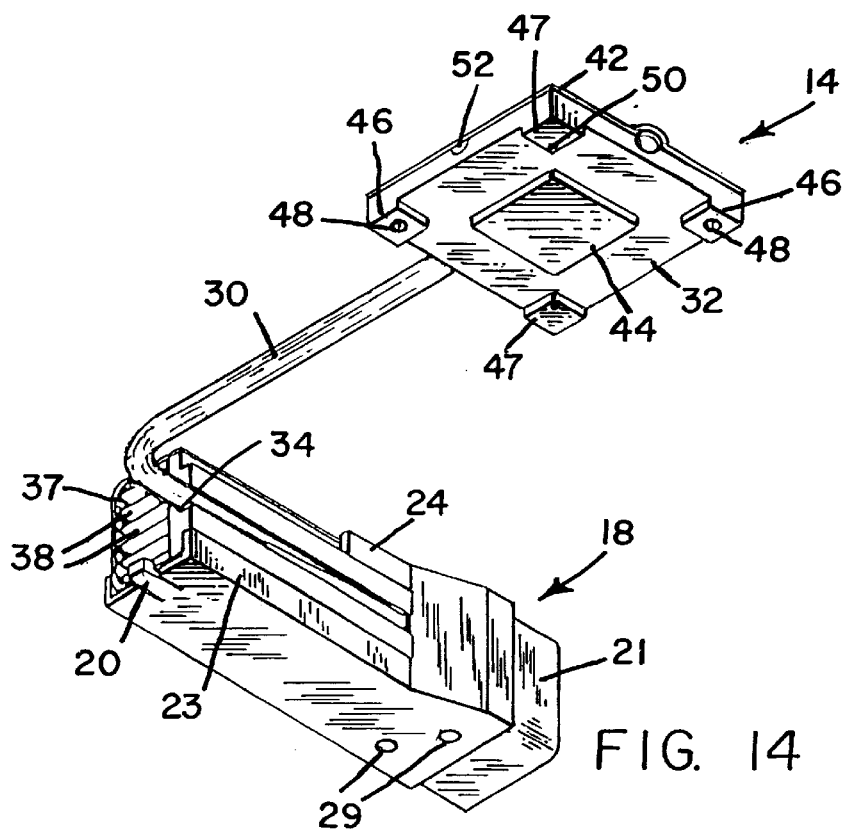
FIG. 14 is an isometric view of the cooling system of the present invention, looking from below the cooling system.
Figure 15:
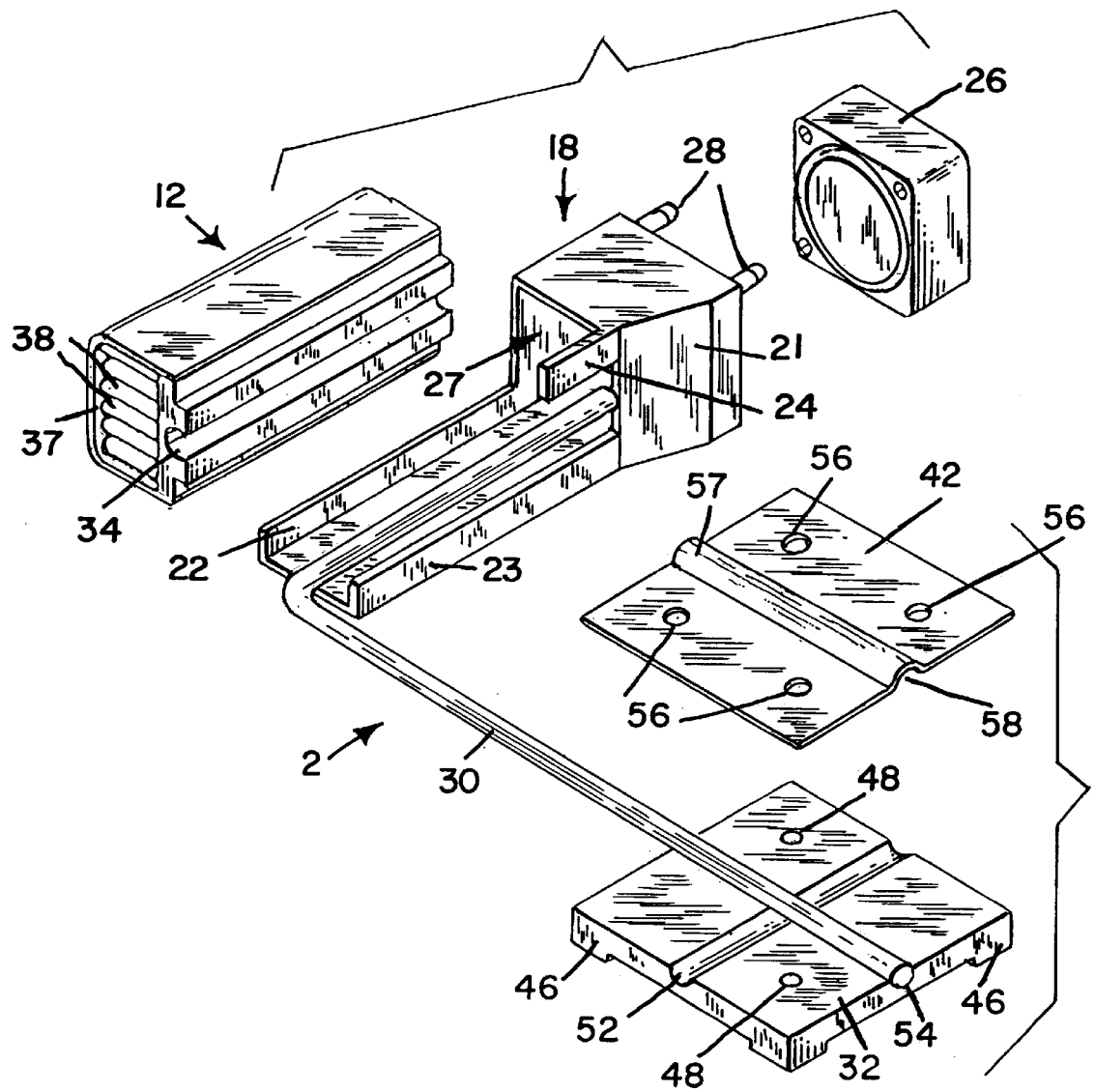
FIG. 15 is an exploded isometric view of the modular components of the cooling system of the present invention.

The heat collector assembly 14 is assembled by placing one end of the heat pipe 30 into the one of the grooves 52 and 54 of the interposer plate 32. In the example shown in FIG. 15, pipe 30 is located within the groove 54. In another application of the invention, involving different orientation of the cooling system elements, the heat pipe would be located in the groove 52. In the example shown in FIG. 15, the cover plate 42 is applied to the top of the interposer plate 32 so that the heat pipe 30 fits into the groove 58 and two of the apertures 56 of the cover plate 42 are vertically aligned with the threaded apertures 48 of the interposer plate 32. The cover plate 42 is secured to the interposer plate 32 by inserting screws 60 through the aperture 56 and threading the screws into the apertures 48. The opposite end of the heat pipe 30 is inserted into the groove 34 of the tubular housing 35, as shown in FIGS. 13 and 14. The heat pipe 30 is secured to the base 25 within the groove 34 by either mechanical wedging, and or by applying thermally conductive adhesive.

Referring to FIGS. 3 and 4, the cooling system 2 is applied to the chassis 3 by positioning the interposer plate 32 so that locating pins on the bottom wall of the chassis enters the apertures 50 to ensure that the center protrusion 44 of the interposer plate registers with the contact surface 11 of the microprocessor package 10. The heat exchange assembly 12 is positioned so that the locating pins 9 on the bottom wall 6 extend into the apertures 29 of the primary housing 18. This accurately locates the heat exchange assembly on the chassis so that inlet opening 37 of the tubular housing 35 is adjacent the inlet opening 7 of the chassis and the baffle plate 13. This also positions the fan 26 at the outlet opening 8 of the chassis.

During operation of the invention, heat from the integrated circuit chip 10b is conducted to the heat conductive pad 11 and to the interposer plate 32. Heat is then conducted from the interposer plate 32 to the heat exchange assembly 12 by the heat pipe 30. Finally, heat is conducted from the heat pipe 30 to the heat sink assembly 19. Fan 26 creates an airflow from the inlet opening 37 to outlet opening 39 of the heat sink assembly 19 and into the plenum chamber 27. This airflow consists of air from outside of the computer which is drawn in through the air inlet opening 7. As the air passes through the heat sink assembly 19, it picks up heat from the fins 38. The fan 26 effectively draws air from the plenum chamber 27 and expels the air outside of the computer through the outlet opening 8. It is also possible to create a heat exchange airflow by utilizing a fan which operates in reverse, whereby outside air is drawn in through opening and forced through the plenum chamber 27 and through the heat sink assembly 19. The heated outside air is then expelled to the outside through the opening 7.

Other heat sink manufacturing processes can be used in fabricating the heat sink in this assembly. The mini-convoluted heat sink can be fabricated by existing convoluted fin heat sink manufacturing technology or by other manufacturing processes, such as extrusion or bonded fins.

The modular cooling system of the present invention can be used with a choice of two sizes of industry-standard miniature brushless 5 VDC or 12 VDC cooling fans. This system can be used in notebook PCs to dissipate 8 to 12 Watts of CPU power, depending on the maximum ambient temperature and processor case maximum temperature specified. Thermal resistance values for the active subassembly (ducted forced airflow with specified fan and heat sink assembly) of the system is shown in the following Table:

| Fan Dimensions | Heat Sink Dimensions | Active Subassembly Thermal Resistance* |
|---|---|---|
| 20 mm × 20 mm × 10 mm | 8 mm × 20 mm × 44.5 mm | 6.8° C/W |
| | 12 × 20 × 44.5 | 5.4 |
| | 14 × 20 × 44.5 | 4.7 |
| 25 mm × 25 mm × 10 mm | 8 mm × 20 mm × 44.5 mm | 5.3° C/W |
| | 12 × 20 × 44.5 | 3.8 |
| | 14 × 20 × 44.5 | 3.3 |

Note: Modeled data shown for average heat sink base-to-ambient air thermal resistance. These data indicate performance for the active subassembly; thermal resistance for the TCP interposer plate, heat pipe, and heat pipe-to-heat sink base must be added to these values.

Empirical data for development models of the cooling system have demonstrated that TCP processor surface temperatures can be maintained within the maximum case temperature specification. This system can also be employed with additional heat sink surface areas, such as a keyboard EMI shield, to provide adequate heat dissipation for peripheral IC components.

The entire heat exchange assembly 12 can be assembled into an electronic system without the use of screws, provided that locating pins 9 are molded into the target system (such as a notebook computer system) and a cover plate or keyboard is used on top of the heat exchange assembly 12 through holes 29 on the bottom of the plastic housing 18 mates with the locating pins 9 to restrict lateral movement of the assembly inside the system. The locating pins 9 can be molded into any surface that can accommodate the assembly and is not limited to the bottom chassis of the computer.

The fan housing may also be integrated into the plastic housing by molding the fan housing features directly into the plastic housing, thus eliminating the step of snapping the fan into the plastic housing.

Figure 19:
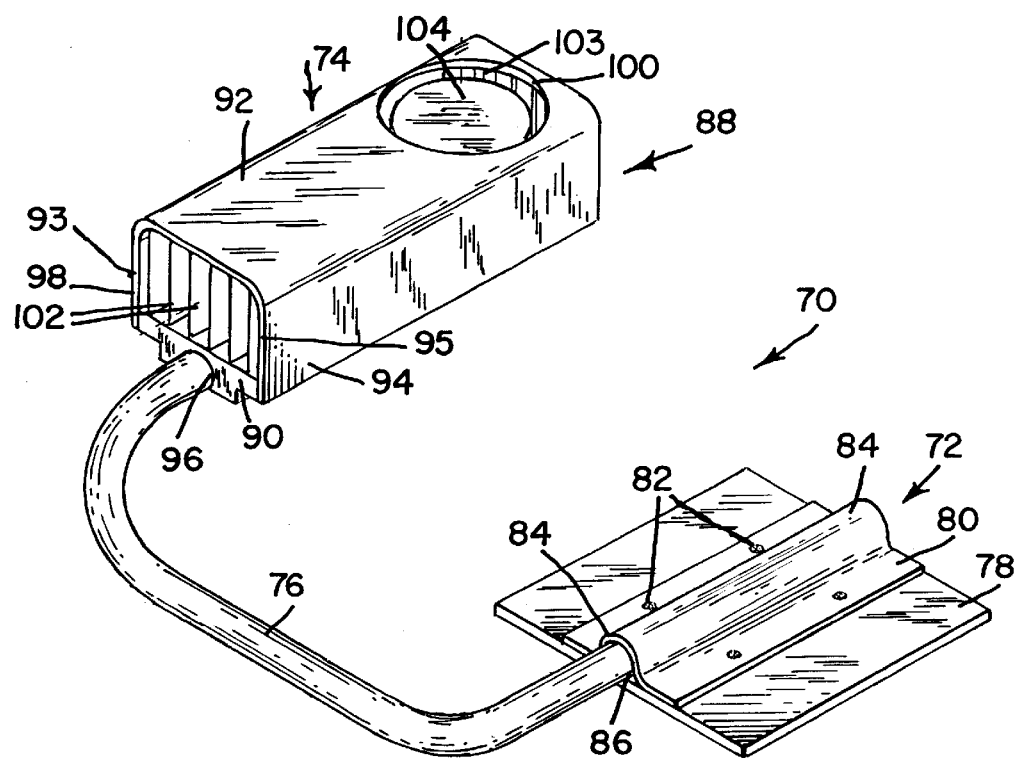
FIGS. 19 and 20 are isometric views of a cooling system consisting of a second embodiment of the invention.
Figure 20:
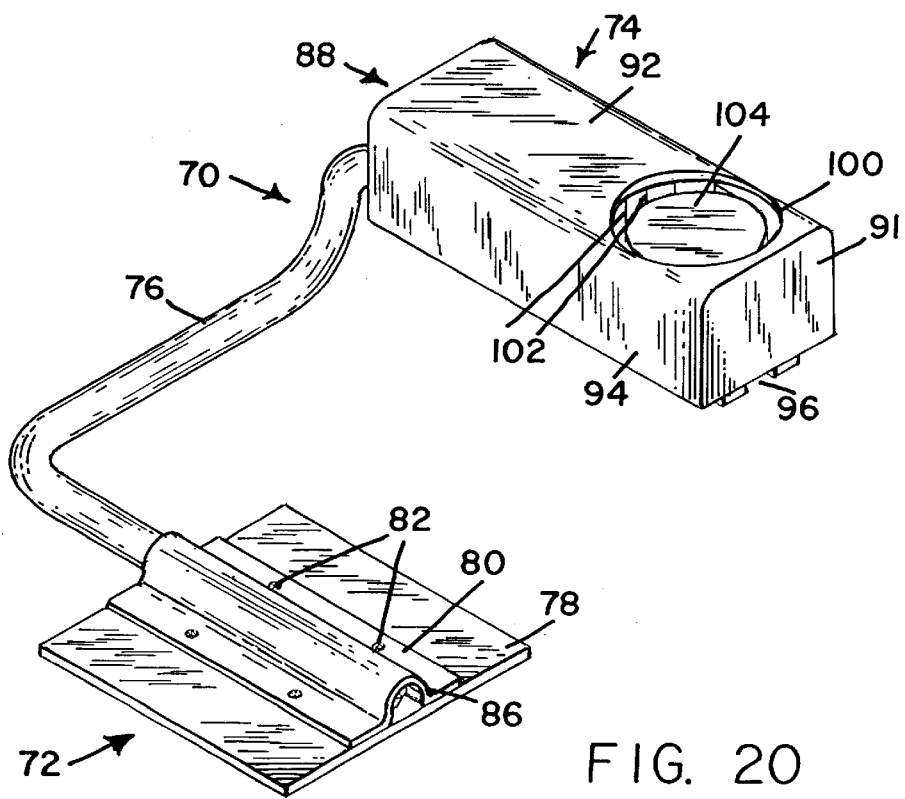

Referring to FIGS. 19 and 20, there is shown a second embodiment of an apparatus for cooling an integrated circuit chip. The second embodiment is generally indicated by the reference numeral 70 and includes a heat collector assembly, generally indicated by the reference numeral 72, a heat exchange assembly, generally indicated by the reference numeral 74, and a heat pipe 76 connected to the heat collector assembly 72 and to the heat exchange assembly 74.

The heat collector assembly 72 includes an interposer plate 78 and a cover plate 80 removably connected to the interposer plate 78 by screws 82. The interposer plate 78 is flat. The cover plate 80 has an uplifted portion 84 which defines a downwardly facing semi-circular groove 86 for receiving one end of the heat pipe 76. The end of the heat pipe is effectively clamped between the top surface of the interposer plate 78 and the uplifted portion 84 of the cover plate 80. The bottom surface of the interposer plate 78 is in contact with the heat conductive pad of the circuit board which contains the integrated circuit chip to be cooled.

The heat exchange assembly 74 includes a rectangular tubular housing, generally indicated by the reference numeral 88. The housing 88 comprises a base wall 90, a back wall 91, a top wall 92, and a pair of side walls 93 and 94. The walls of the housing 88 define a cavity 95 which has an inlet opening 100 in the top wall 92 and an outlet opening 98 at the front end of the housing which is opposite the back wall 91. The base wall 90 has a downwardly facing semi-circular groove 96 which extends longitudinally of the housing for receiving the opposite end of the heat pipe 76. The heat pipe 76 is secured within the groove 96, preferably by a thermally conductive adhesive. A fan 104 is located in the cavity 98 below the inlet opening 100. The fan 104 has a rotor which is perpendicular to the base wall 90 and blades which extend radially from the rotor. A plurality of spaced heat conductive and heat dissipating fins 102 extend longitudinally in the cavity 98 from the outlet opening 98 to the fan 104. The fins 102 are part of a convoluted structure formed from a single sheet of bendable thermally conductive and heat radiating material. Fins 102 are fixed to the base wall 90 and the top wall 92. Another group of spaced fins 103 extend from the inlet opening 100 for a short distance to the back wall 91.

Figure 21:
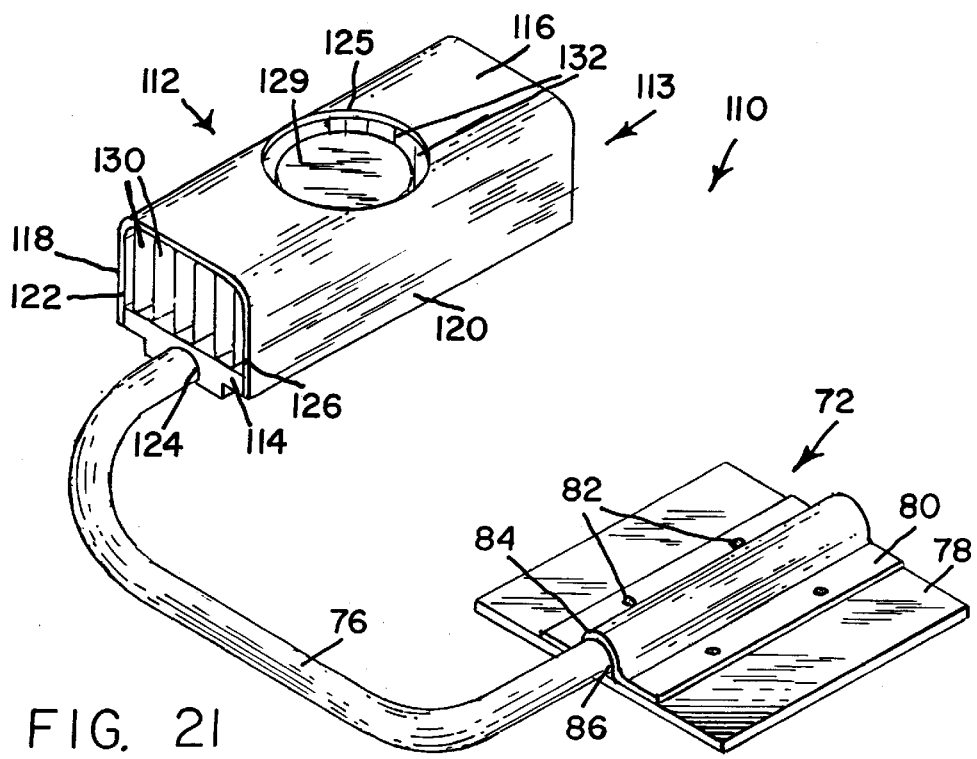
FIGS. 21 and 22 are isometric views of a cooling system consisting of a third embodiment of the invention.
Figure 22:
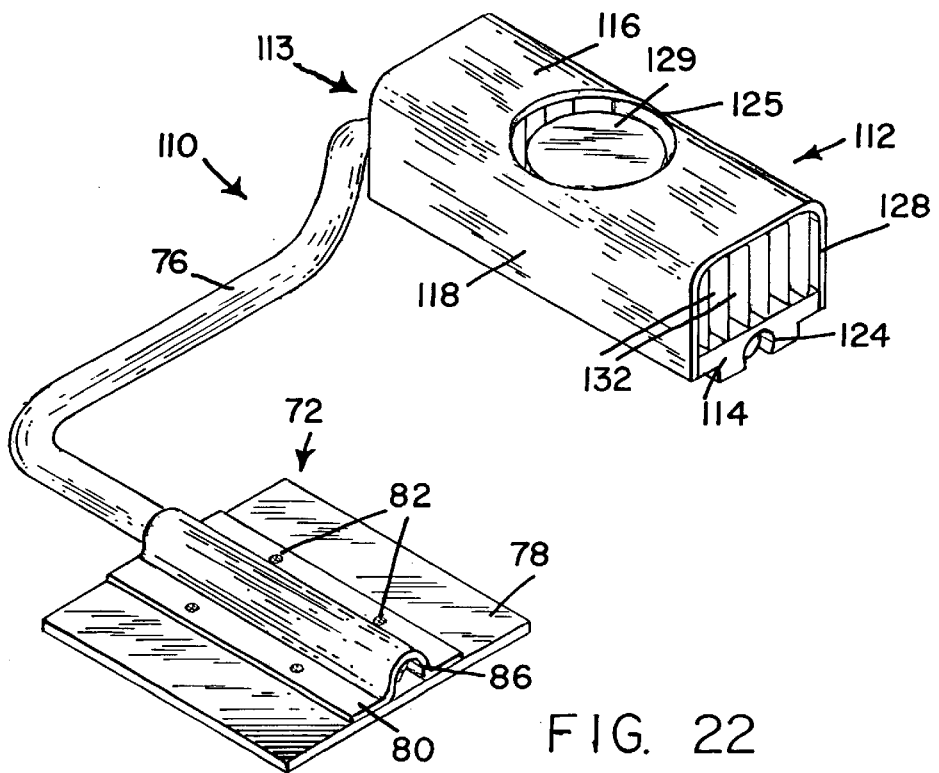

Referring to FIGS. 21 and 22, there is shown a third embodiment of an apparatus for cooling an integrated circuit chip. The third embodiment is generally indicated by the reference numeral 110 and comprises a heat exchange assembly, generally indicated by the reference numeral 112, the previously described heat collector assembly 72, and heat pipe 76.

The heat exchange assembly 112 comprises a rectangular tubular housing, generally indicated by the reference numeral 113. Housing 113 comprises a base wall 114, a top wall 116, and a pair of side walls 118 and 120 which define a cavity 122. The base wall 114 has a downwardly facing and longitudinally extending semi-circular groove 124 for receiving one end of the heat pipe 76. The top wall 116 has a circular air inlet opening 125 to the cavity 122. A first end of the housing 113 has a first inlet opening 126 to the cavity 122. A second end of the housing has an air outlet opening 128 to the cavity 122. A small DC fan 129 is located in the cavity 122 below the air inlet opening 125. A plurality of a spaced heat dissipating fins 130 extend from the fan 129 to the first outlet opening 126. A plurality of spaced heat dissipating fins 132 extend from the fan 129 to the second outlet opening 128. Each group of fins 130 and 132 is formed from a sheet of bendable thermally conductive and heat radiating material as described in connection with previously described embodiments of the invention. During the operation of the heat exchange assembly 112, the fan 129 draws air into the cavity 122 through the air inlet opening 125 and pushes the air between the fins 130 and 132 toward the first and second outlet openings 126 and 128, respectively, at which point air is expelled from the housing 113. Heat generated by the integrated circuit chip to be cooled is taken up by the interposer plate 78 and conducted to the opposite end of the heat pipe 76. Heat from this end of the heat pipe is conducted to one end of the heat pipe which is in contact with the base wall 114. Heat is then conducted from the base wall 114 to the fins 130 and 132. Heat from the fins 130 and 132 is finally dissipated by the flow of air between the fins which is created by the fan 129.

Figure 23:
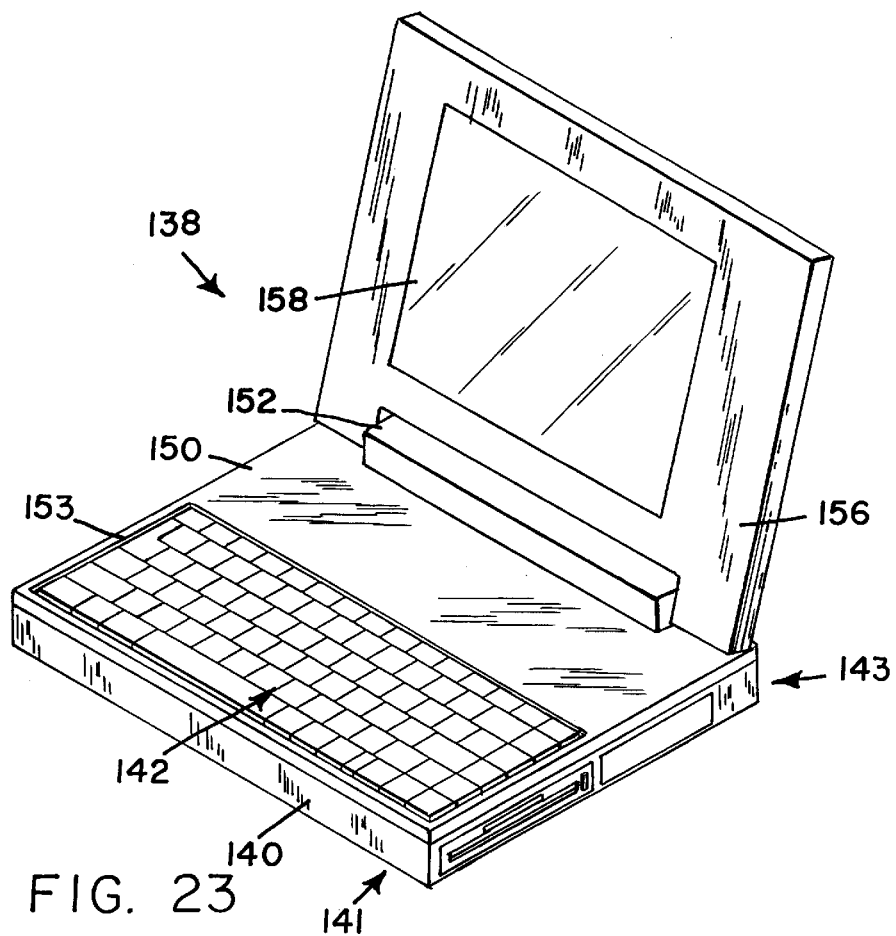
FIG. 23 is an isometric view of a notebook computer and cooling system combination of the present invention, looking from the front of the computer.
Figure 24:
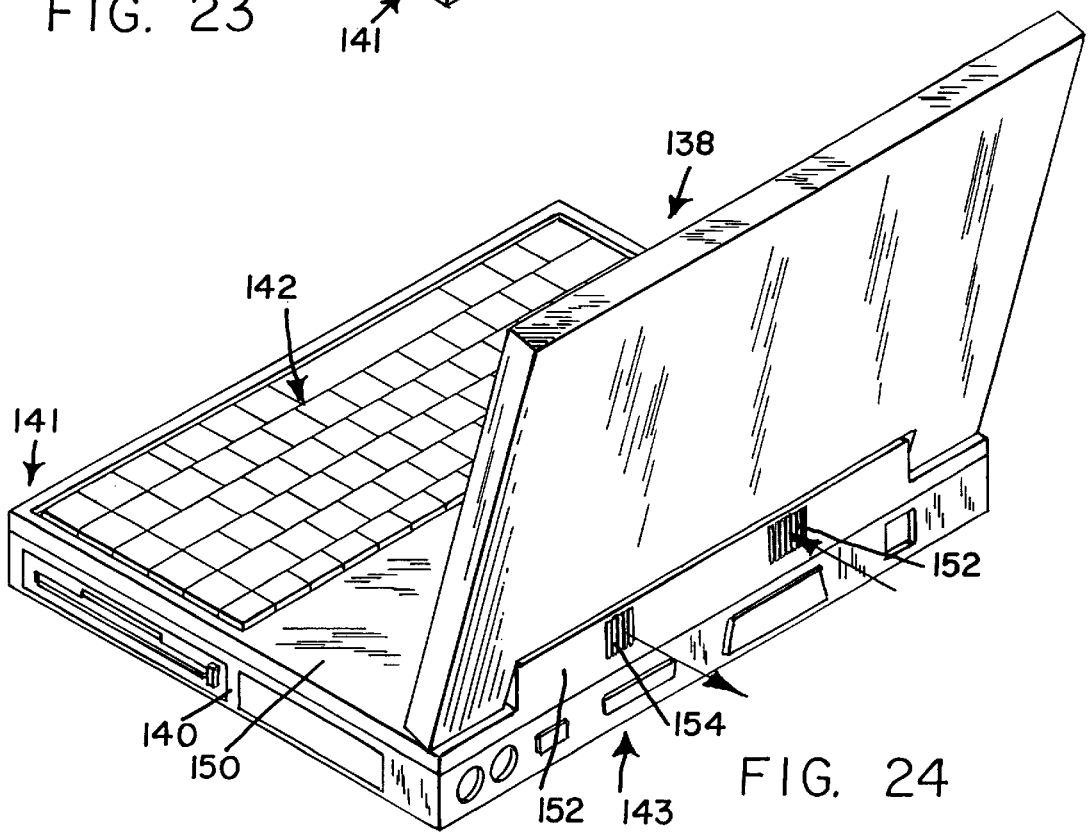
FIG. 24 is an isometric view of the computer of FIG. 23, looking from the back of the computer.
Figure 25:
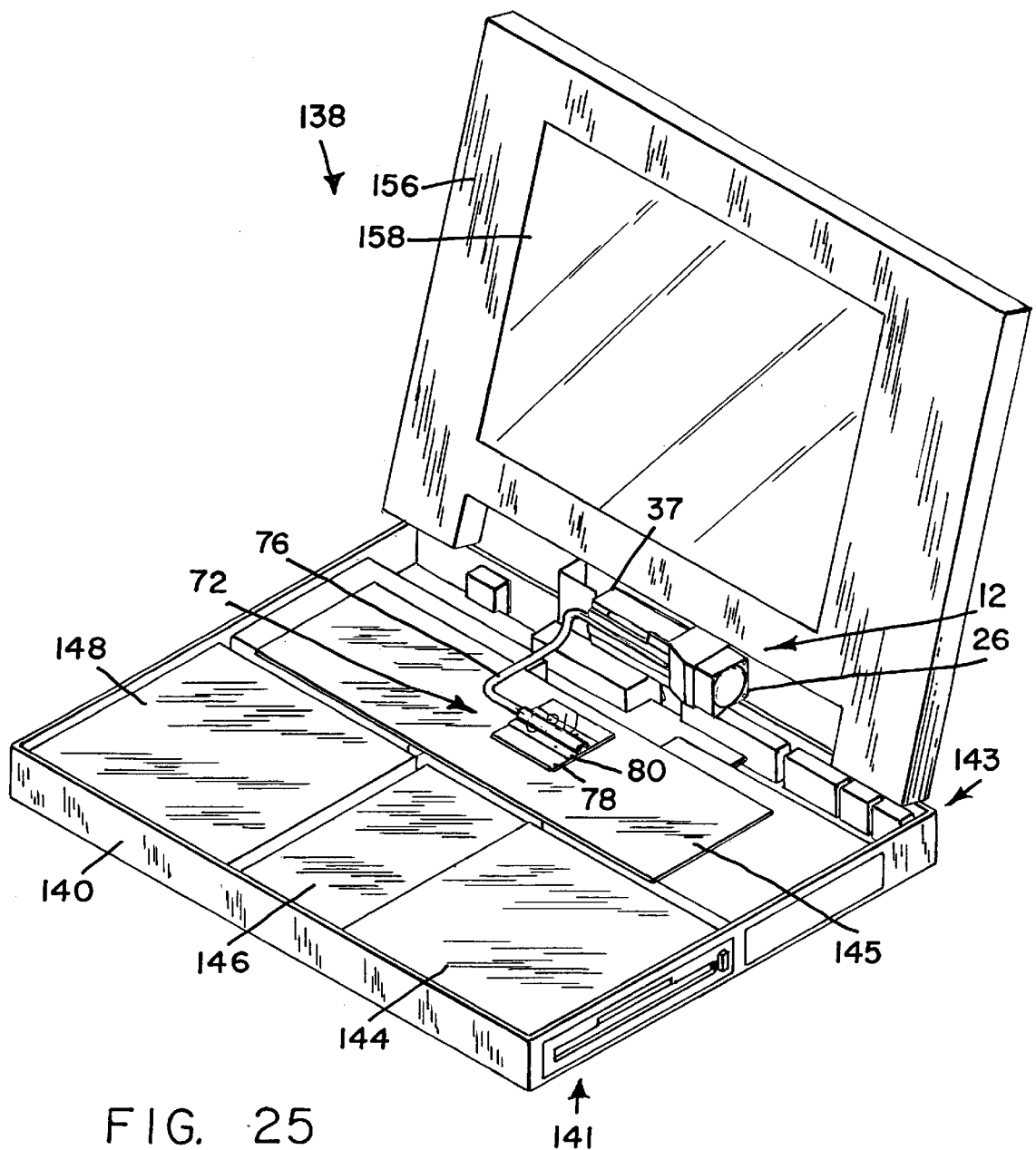
FIG. 25 is an isometric view of the computer of FIG. 23 with the intermediate cover removed and looking from the front of the computer.
Figure 26:
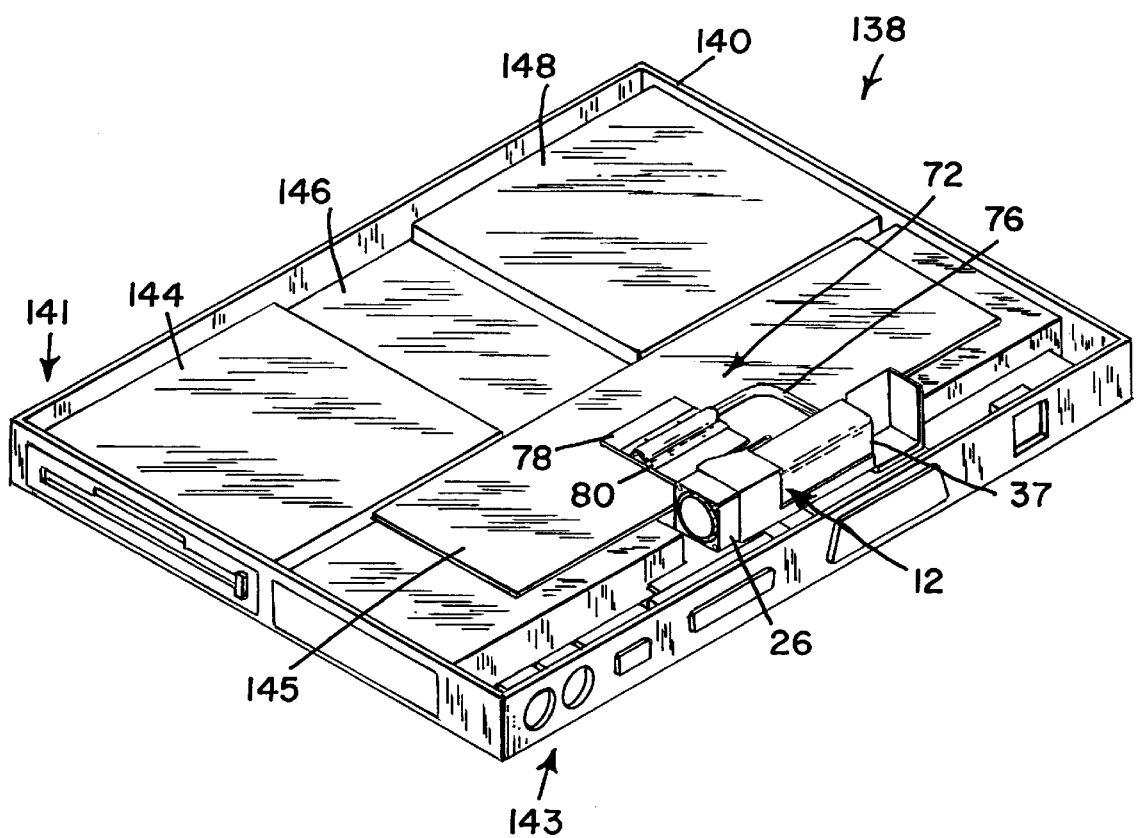
FIG. 26 is an isometric view of the computer of FIG. 24 with the intermediate and outer covers removed and looking from the back of the computer.

Referring to FIGS. 23–26, there is shown a notebook computer of the present invention, generally indicated by the reference numeral 138. The computer 138 includes a chassis 140 having a front end, generally indicated by the reference numeral 141, and a back end, generally indicated by the reference numeral 143. The front end of the computer 138 has a keyboard, generally indicated by the reference numeral 142, which overlies a floppy drive 144, a keyboard controller 146 and a battery 148. A circuit board 145 is located near the back end of the computer 138. The circuit board 145 includes an integrated circuit chip and a heat conducted pad. A heat collector assembly, such as the heat collector assembly 72, is mounted on the circuit board 145 so that the interposer plate 78 is in heat conductive contact with the heat conductive pad. A heat exchange assembly, such as heat exchange assembly 12, is mounted along the back edge of the computer, as shown in FIGS. 25 and 26 and is operatively connected to the heat collector assembly 72 by heat pipe 76. The computer 143 has an intermediate cover 150 which has a front opening 153 for the keys 142 and an upwardly extending outer housing 152 which extends along the back edge of the computer. The outer housing 152 has an air inlet opening 152 and an air outlet opening 154 which face away from the front of the computer. The outer housing 152 encloses the heat exchange assembly 12 so that the air inlet opening 37 of the heat exchange assembly is adjacent the air inlet opening 152 and the fan 26 is adjacent the air outlet opening 154. An outer cover 156 is hingedly connected to the elongated outer housing 152 for movement between an upright position, as shown in FIGS. 23 and 24, to a closed horizontal position in which the outer cover 156 overlies the keys 142. The inner surface of the outer cover 156 includes a display screen 158. Heat generated by the integrated circuit chip 147 is transferred from the heat collector assembly 72 to the heat exchange assembly 12. The heat is dissipated to the atmosphere by ambient air drawn in through the inlet opening 52 and expelled through the outlet opening 154 by the fan 26. The heat exchange assembly 12 effectively dissipates heat generated by a high performance integrated circuit chip without imposing to a significant degree on the critical space requirements of the notebook computer. Since the heat exchange assembly 12 is positioned within the outer housing 152 which forms one of hinge components of the outer cover 156, the heat exchange assembly 12 is effectively located along the hinge axis of the outer cover. Although the heat exchange assembly 12 is shown by way of example in FIGS. 25 and 26, any of the heat exchange assemblies previously described in this application may be utilized, depending on the power and heat dissipating requirements of the computer.

Clearly minor changes may be made in the form and construction of this invention and the embodiments described without departing from the material spirit thereof. Therefore, it is not desired to confine the invention to the exact forms shown herein and described but it is desired to include all such as properly come within the scope claimed.

The invention having been thus described, what is claimed as new and desire to secure by Letters Patent is:

1. An apparatus comprising:
    (a) a heat collector assembly mounted on a circuit board and operatively connected to an integrated circuit chip, the circuit board being located in a computer chassis;
    (b) a heat exchange assembly mounted in the computer chassis, the heat exchange assembly comprising:
        (1) a primary housing having a plenum chamber, an inlet opening to the plenum chamber and an outlet opening to the plenum chamber;
        (2) an electrical fan in operative register with the outlet opening to the plenum chamber;
        (3) a secondary housing having a cavity, an outlet opening to the cavity and an inlet opening to the cavity, the outlet opening to the cavity being in operative register with the inlet opening to the plenum chamber;
        (4) wherein the primary housing has at least one supporting wall extending away from the inlet opening to the plenum chamber to support the secondary housing and a latch to releasably maintain the secondary housing connected to the primary housing; and
        (5) a plurality of spaced heat exchange fins operatively connected to the secondary housing within the cavity and extending from the inlet opening to the cavity to the outlet opening to the cavity; and
    (c) a heat pipe having a first end operatively connected to the heat collector assembly and a second end operatively connected to the secondary housing.

2. An apparatus as recited in claim 1, wherein the secondary housing is removably connected to the primary housing by the latch and the fan is removably connected to the primary housing.

3. An apparatus as recited in claim 2, wherein the primary housing has a plurality of outwardly projecting pins adjacent the outlet opening to the plenum chamber and the fan has a plurality of holes for receiving the pins in a snug fit.

4. An apparatus as recited in claim 3, wherein the primary housing is made of a thermoplastic material, the secondary housing is made of a thermally conductive material and the fan has a housing which contains the holes.

5. An apparatus as recited in claim 1, wherein the latch comprises rails on the primary housing to allow the secondary housing to move longitudinally toward and away from the inlet opening to the cavity and to prevent the secondary housing from moving laterally relative to the primary housing and wherein the latch comprises a resiliently flexible retaining tab engaging the inlet opening to the cavity to prevent the secondary housing from moving longitudinally relative to the primary housing when the secondary housing is connected to the primary housing.

6. An apparatus as recited in claim 5, wherein the primary housing has an end surface which faces away from the secondary housing and wherein the retaining tab has a lip which engages the end surface when the secondary housing is connected to the primary housing, the lip being clear of the end surface upon bending the retaining tab away from the secondary housing thereby allowing the secondary housing to be moved longitudinally relative to the primary housing.

7. An apparatus as recited in claim 1, wherein the primary housing is made of a thermoplastic material and the secondary housing is made of a thermally conductive material.

8. An apparatus as recited in claim 1, wherein the heat pipe is circular and the secondary housing has a base wall in contact with the heat exchange fins, the base wall having an outer surface with an elongated groove that is circular in cross section for receiving the second end of the heat pipe.

9. An apparatus as recited in claim 1, wherein the heat collector assembly comprises:

(a) an interposer plate having a first surface operatively connected to the integrated circuit chip and a second surface with an elongated first groove for receiving the first end of the heat pipe;

(b) a cover plate having an elongated second groove; and (c) a fastener to connect the cover plate to the interposer plate so that the second groove faces the first groove and the first end of the heat pipe lies in the first and second grooves.

10. An apparatus as recited in claim 9, wherein the heat pipe is circular and each of the first and second grooves is circular in cross section.

11. An apparatus as recited in claim 9, wherein the first surface of the interposer plate has a central protrusion operatively connected to the integrated circuit chip and a plurality of outer protrusions spaced from the central protrusion so that when the first surface of the interposer plate lies on a flat supporting surface, access channels are formed between the supporting surface and the first surface of the interposer plate.

12. An apparatus as recited in claim 1, wherein the computer chassis has a plurality of locating pins and wherein the primary housing has a plurality of apertures for receiving the locating pins.

13. An apparatus as recited in claim 1, wherein the primary housing includes two opposed spaced walls of thermally conductive material and the heat exchange fins comprise a sheet of thermally conductive material convoluted to define the fins and fixed to the two spaced opposed walls.

14. An apparatus comprising:

a heat collector assembly mounted on a circuit board and operatively connected to an integrated circuit chip, the circuit board being located in a computer chassis;

a heat exchange assembly mounted in the computer chassis, the heat exchange assembly comprising:

a primary housing having a plenum chamber, an inlet opening to the plenum chamber and an outlet opening to the plenum chamber;

an electrical fan in operative register with the outlet opening to the plenum chamber;

a secondary housing having a cavity, an outlet opening to the cavity and an inlet opening to the cavity, the outlet opening to the cavity being in operative register with the inlet opening to the plenum chamber;

at least one supporting wall extending away from the inlet opening to the plenum chamber to support the secondary housing;

a latch to releasably maintain the secondary housing connected to the primary housing, the latch comprising rails on the primary housing to allow the secondary housing to move longitudinally toward and away from the inlet opening to the cavity and to prevent the secondary housing from moving laterally relative to the primary housing, the latch further comprising a resiliently flexible retaining tab engaging the inlet opening to the cavity; and a heat pipe having a first end operatively connected to the heat collector assembly and a second end operatively connected to the secondary housing.

15. An apparatus as recited in claim 14, wherein the primary housing has an end surface which faces away from the secondary housing and wherein the retaining tab has a lip which engages the end surface when the secondary housing is connected to the primary housing, the lip being clear of the end surface upon bending the retaining tab away from the secondary housing thereby allowing the secondary housing to be moved longitudinally relative to the primary housing.

16. An apparatus as recited in claim 14, wherein the heat pipe is circular and the secondary housing has a base wall in contact with the heat exchange fins, the base wall having an outer surface with an elongated groove that is circular in cross section for receiving the second end of the heat pipe.

17. An apparatus as recited in claim 14, wherein the primary housing includes two opposed spaced walls of thermally conductive material and further comprising at least one sheet of thermally conductive material fixed to the two spaced opposed walls and convoluted to define heat exchange fins.

18. An apparatus comprising:

means for collecting heat from an integrated circuit chip on a circuit board in a computer chassis;

a heat exchange assembly comprising:

means for housing a plenum chamber with an inlet opening and an outlet opening;

means for housing a cavity with an inlet opening and an outlet opening, the outlet opening being in communication with the plenum chamber inlet opening;

means for drawing air from the plenum chamber and the cavity through the plenum chamber outlet opening;

means for releasably latching the cavity housing means to the plenum chamber housing means;

means for radiating heat into the cavity;

means for conducting heat from the heat collecting means to the heat radiating means.

19. An apparatus as recited in claim 18, further comprising means extending from the plenum chamber housing means for removably connecting the air drawing means to the plenum chamber housing means.

20. An apparatus as recited in claim 18, wherein the releasably latching means comprises means for allowing the plenum chamber housing means and the cavity housing means to move toward and away from each other longitudinally but not laterally and means on the plenum chamber housing means for resiliently engaging an end of the cavity housing means for preventing longitudinal movement.

21. An apparatus as recited in claim 20, wherein the means for resiliently engaging comprises a bendable lip for engaging an end surface of the plenum chamber housing means, the lip being bendable away from the end surface to release the plenum chamber housing means.

22. An apparatus as recited in claim 18, wherein the plenum chamber housing means is made from a dielectric material and the heat radiating means is made from a conductive material.

23. An apparatus as recited in claim 18, wherein the cavity housing means further comprises means for supporting the heat radiating means and wherein the heat radiating means and the heat conducting means are both connected to the supporting means.

24. An apparatus as recited in claim 18, wherein the heat collecting means comprises:
  means for contacting the integrated circuit chip:
    means for receiving the heat conducting means in contact with the means for contacting the integrated circuit chip; and
    means for securing the heat conducting means to the means for receiving the heat conducting means.

25. An apparatus as recited in claim 18, wherein the heat radiating means comprises convoluted thermally conductive material fixed within the cavity.

* * * * *